United States Patent
Mastromatteo et al.

(10) Patent No.: US 6,487,000 B2
(45) Date of Patent: Nov. 26, 2002

(54) MICROELECTROMECHANICAL STRUCTURE COMPRISING DISTINCT PARTS MECHANICALLY CONNECTED THROUGH A TRANSLATION/ROTATION CONVERSION ASSEMBLY

(75) Inventors: Ubaldo Mastromatteo, Bareggio (IT); Bruno Murari, Monza (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/925,847

(22) Filed: Aug. 8, 2001

(65) Prior Publication Data

US 2002/0041729 A1 Apr. 11, 2002

(30) Foreign Application Priority Data

Aug. 9, 2000 (EP) .............................................. 00830570

(51) Int. Cl.[7] ............................. G02B 26/00; G02F 1/29
(52) U.S. Cl. ....................................... 359/291; 359/318
(58) Field of Search ................................ 359/223, 224, 359/290, 291, 298, 318, 320; 385/18

(56) References Cited

U.S. PATENT DOCUMENTS

| | | | | | |
|---|---|---|---|---|---|
| 5,485,304 A | * | 1/1996 | Kaeriyama | ................... | 359/291 |
| 5,867,302 A |   | 2/1999 | Fleming | ..................... | 359/291 |
| 5,962,949 A |   | 10/1999 | Dhuler et al. | ................ | 310/307 |
| 6,025,951 A | * | 2/2000 | Swart et al. | ................. | 359/245 |
| 6,028,689 A |   | 2/2000 | Michalicek et al. | ........ | 359/224 |
| 6,388,789 B1 | * | 5/2002 | Bernstein | ..................... | 359/198 |
| 6,404,313 B2 | * | 6/2002 | Asada | .......................... | 335/222 |

FOREIGN PATENT DOCUMENTS

| | | |
|---|---|---|
| EP | 0902538 A2 | 3/1999 |
| EP | 0949527 A1 | 10/1999 |
| JP | 7-177773 | 7/1995 |
| JP | 07177773 | 7/1995 |
| JP | 9-009649 | 1/1997 |
| JP | 09009649 | 1/1997 |

* cited by examiner

*Primary Examiner*—Georgia Epps
*Assistant Examiner*—Saeed Seyrafi
(74) *Attorney, Agent, or Firm*—Lisa K. Jorgenson; Robert Iannucci; Seed IP Law Group PLLC

(57) ABSTRACT

A microelectromechanical structure, usable in an optical switch for directing a light beam towards one of two light guide elements, including: a mirror element, rotatably movable; an actuator, which can translate; and a motion conversion assembly, arranged between the mirror element and the actuator. The motion conversion assembly includes a projection integral with the mirror element and elastic engagement elements integral with the actuator and elastically loaded towards the projection. The elastic engagement elements are formed by metal plates fixed to the actuator at one of their ends and engaging the projection with an abutting edge countershaped with respect to the projection.

18 Claims, 4 Drawing Sheets

MICROELECTROMECHANICAL STRUCTURE COMPRISING DISTINCT PARTS MECHANICALLY CONNECTED THROUGH A TRANSLATION/ROTATION CONVERSION ASSEMBLY

BACKGROUND OF THE INVENTION

1. Technical Field

The present invention refers to a microelectromechanical structure comprising distinct parts mechanically connected through a translation-to-rotation motion converting assembly.

2. Description of the Related Art

As is known, optical devices formed by microelectromechanical structures (MEMs) are currently studied for guiding laser light beams. These optical devices in general comprise switches that have the function of deflecting the laser light beams and are controlled by electronic circuitry, preferably integrated circuits, associated to the devices.

FIG. 1 is a schematic representation of an optical device 1 of the indicated type, which comprises a first optical transmission element 2, a second optical transmission element 3, and a third optical transmission element 4. The optical transmission elements may be of any type, for example optical fibers, waveguides, etc. The second optical transmission element 3 is arranged at 90° with respect to the first optical transmission element 2, whereas the third optical transmission element 4 is arranged at preset angle, different from 90°, with respect to the first optical transmission element 2.

An optical switch 7 is arranged between the optical transmission elements 2–4 to direct an incident light ray, which traverses the first optical transmission element 2, selectively towards the second optical transmission element 3 or the third optical transmission element 4. The optical switch 7 comprises a mirror element 8 and a control structure (not shown) which rotates the mirror element 8 between a first position (indicated by the solid line) and a second position (indicated by the dashed line). In the first position, the mirror element 8 is arranged at 45° with respect to the first optical transmission element 2 and the second optical transmission element 3, so that an incident ray 9, supplied by the first optical transmission element 2, is reflected towards the second optical transmission element 3 (reflected ray 10 represented by a solid line), whilst in the second position, the mirror element 8 is arranged at an angle different from 45° with respect to the first optical transmission element 2 and the second optical transmission element 3, and the incident ray 9 is reflected towards the third optical transmission element 4 (reflected ray 11 represented by a dashed-and-dotted line).

The third optical transmission element 4 may not be present. In this case, the optical switch 7 operates as an on/off switch, which enables or disables transmission of the light ray 9.

Rotation of the mirror element 8 is obtained by applying a twisting moment lying in the plane of the mirror element 8, which is suspended from a bearing structure through spring elements (two or four, according to the number of desired freedom degrees). At present, the twisting moment necessary for rotating the mirror element 8 is generated in two ways: via electrostatic forces acting directly on the mirror element 8, or via a mechanical conversion assembly which converts a translation of a linear actuator into a rotation.

FIG. 2 is a schematic representation of an electrostatic actuation system. The mirror element 8 is formed by a platform 15 of semiconductor material suspended from a frame 18 through two spring elements 17a extending in the X direction starting from two opposite sides of the platform 15. The frame 18 is in turn supported by a first wafer 16 of semiconductor material through two spring elements 17b extending in the Y direction starting from two opposite sides of the platform 15. The spring elements 17a, 17b of each pair are aligned to one another and are sized in order to be substantially rigid to tension/compression and to be compliant to torsion, so as to form pairs of axes of rotation of the platform 15. Specifically, the spring elements 17a define an axis of rotation parallel to the X axis, and the spring elements 17b define an axis of rotation parallel to the Y axis. In the vicinity of its four corners, the platform 15 has, on the underside, electrodes 20 facing corresponding counterelectrodes 21 arranged on a second wafer 22, arranged underneath. When appropriate differences of potential are applied between one pair of electrodes 20 and the respective counterelectrodes 21, one side of the platform 15 is subjected to an attractive force (arrows F in FIG. 2), which generates a twisting moment M about two opposed spring elements (in this case the spring elements 17a), so causing rotation of the platform 15 in the desired direction and with the desired angle.

FIG. 3 is a schematic representation of a mechanical actuation system. Also in this case, the mirror element 8 is formed by a platform 15 made of semiconductor material supported by the first wafer 16 through spring elements 17a, 17b and through the frame 18.

On the underside of the platform 15 is arranged an element having the shape of a frustum of a pyramid integral with the platform 15 and defining a lever 25. The lever 25 is engaged by four projecting elements, in this case four walls 26 extending vertically upwards starting from a plate 27 and each arranged perpendicular to the adjacent walls 26. The plate 27 (illustrated in greater detail in FIG. 4) is suspended from a frame 30 through two spring elements 28 extending in the X direction starting from two opposite sides of the plate 27. The frame 30 is in turn supported by the second wafer 22 through two spring elements 31 extending in the Y direction starting from two opposite sides of the frame 30. The spring elements 28, 31 are sized in such a way as to be compliant, respectively, in the Y direction and in the X direction, and to be more rigid to rotation.

According to what is illustrated in FIG. 5, the plate 27 is suspended above a cavity 34 present in one protection layer 36 (for instance, a layer of silicon dioxide) which overlies a substrate 35 belonging to the second wafer 22 and in which there are formed integrated components belonging to the control circuitry. The plate 27 is conveniently made in a third wafer 37 bonded between the first wafer 16 and the second wafer 22.

The plate 27 may translate as a result of the electrostatic attraction between actuating electrodes 38, 39. For this purpose, on the underside of the plate 27 there are present mobile electrodes 38 facing fixed electrodes 39 formed on the bottom of the cavity 34. In use, the mobile electrodes 38 and the fixed electrodes 39 are biased in such a way as to generate a translation of the plate 27 in the X direction or in the Y direction or in a vector combination of the two directions, exploiting the elastic compliance of the spring elements 28 and 31 in both directions.

The walls 26-lever 25 ensemble form a conversion assembly 40 that converts the translation of the plate 27 into a rotation of the platform 15, as illustrated in FIG. 5, which illustrates the effect of a displacement in the X direction of the plate 27. This displacement determines, in fact, a corresponding displacement of the walls 26, in particular, of the wall 26 on the left in FIG. 5; this wall 26, by engaging the lever 25, draws it towards the right, thus determining a rotation of the platform 15 by an angle $\theta$ about the spring elements 17b (one of which may be seen in FIG. 3), which are represented by the axis 17 in FIG. 5.

The linear actuation of the plate 27 thus enables rotation of the platform 15 about the axes defined by the spring elements 17a or 17b or both, so enabling the platform 15 to assume a plurality of angular positions that may be controlled through the actuation electrodes 38, 39.

The described conversion assembly 40 is affected by hysteresis, which limits the precision in the control of the platform 15 and causes part of the movement of the plate 27 to be ineffective. In fact, to ensure the engagement of the lever 25 with the walls 26 also in presence of misalignments between the first wafer 16 and the third wafer 37 and to take into account the fabrication tolerances as regards the height of the walls 26, as well as the shape of the latter and of the lever 25, the pairs of facing walls 26 are arranged at a greater distance than necessary for engaging the lever 25, as indicated by the solid line and, in an exaggerated way, in detail in FIG. 6. As a result, in the first part of the movement of the plate 27, it may happen that the wall 26, which should interact with the lever 25, fails to engage the lever 25 immediately and does not cause rotation of the platform 15 at once. For example, in FIG. 6, for a displacement of the plate 27 in the direction of the arrows, the rotation of the platform 15 starts only when the wall 26 on the left arrives in contact with the lever 25 and the plate 27 has displaced by the amount $\Delta X$. The same applies, in the illustrated example, for a displacement of the plate 27 in the direction opposite to that of the arrow, even though in general the amount of displacement in one direction or the other is different and not correlated.

The same problem of hysteresis described above afflicts in general all the microstructures formed by a translating part and a rotating part connected by an assembly for converting the translation into a rotation, the assembly having a play or hysteresis as a result of the tolerances and fabrication imprecisions.

SUMMARY OF THE INVENTION

An embodiment of the invention provides a microelectromechanical structure having an motion converting assembly that is free from the problem referred to above.

The microelectromechanical structure is usable in an optical switch for directing a light beam towards one of two light guide elements. The structure includes: a rotatably movable mirror element; an actuator that is movable with translatory motion; and a motion conversion assembly arranged between the mirror element and the actuator. The motion conversion assembly includes a projection integral with the mirror element and elastic engagement elements integral with the actuator and elastically loaded towards the projection. The elastic engagement elements are formed by metal plates fixed to the actuator at one of their ends and engaging the projection with an abutting edge countershaped with respect to the projection.

A process for manufacturing a microelectromechanical structure is further provided, including the steps of forming a first part which is rotatably movable, the first part including a projection, forming a second part that is movable with translatory motion, the second part including elastic engagement elements, and assembling the first and second parts, in that, during the assembling step, the elastic engagement elements automatically and elastically engage the projection.

BRIEF DESCRIPTION OF THE DRAWINGS

For understanding the present invention, a description of a preferred embodiment thereof is now provided, purely as a non-limiting example with reference to the attached drawings, wherein.

DETAILED DESCRIPTION OF THE INVENTION

Figure 7:
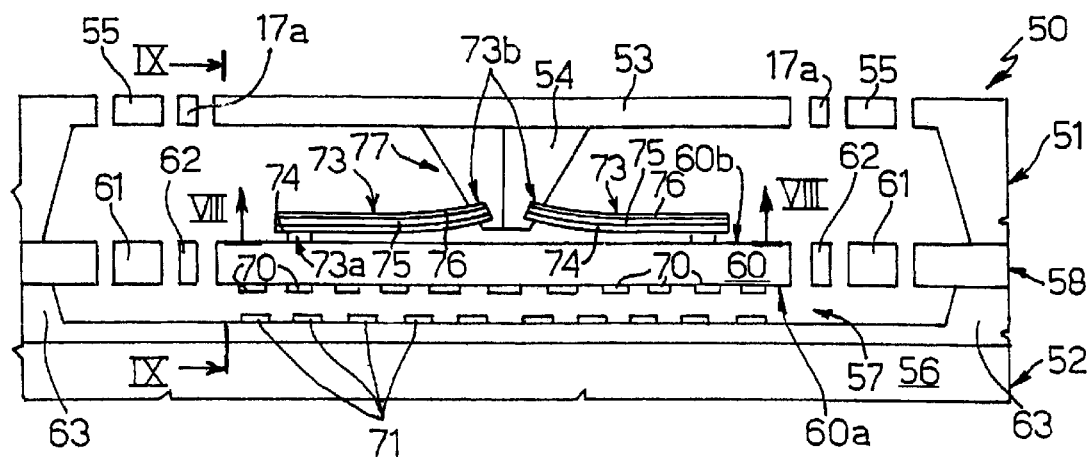
FIG. 7 shows a cross-section view, similar to that of FIG. 5, of a microelectromechanical structure comprising a motion converting assembly, of a self-centering type, according to the invention.

In FIG. 7, a microelectromechanical structure 50 comprises a first wafer or body 51, a second wafer or body 52, and a third wafer or body 58, the latter wafer being arranged between the first wafer 51 and the second wafer 52, which are bonded together.

Figure 1:
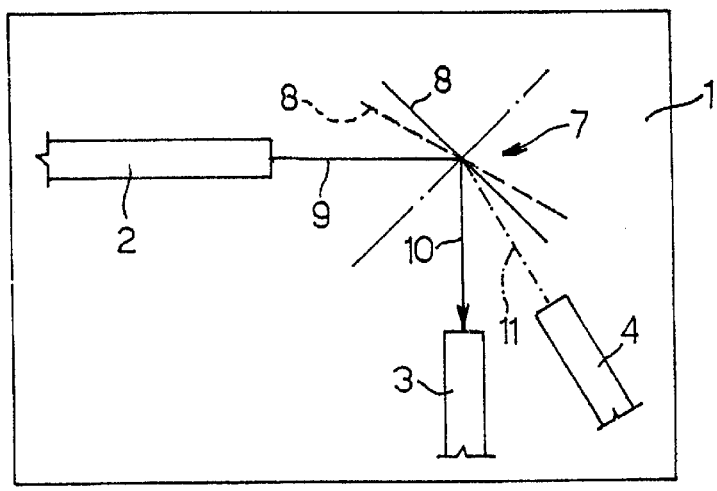
FIG. 1 shows a simplified diagram of a known optical device having a switch.
Figure 2:
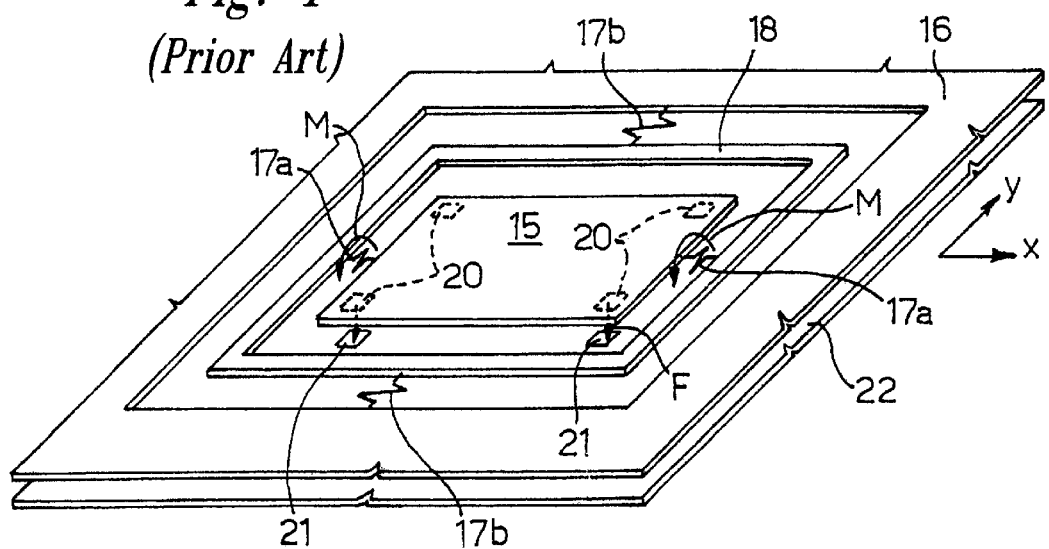
FIG. 2 shows a simplified perspective view of a first embodiment of a known switch.
Figure 3:
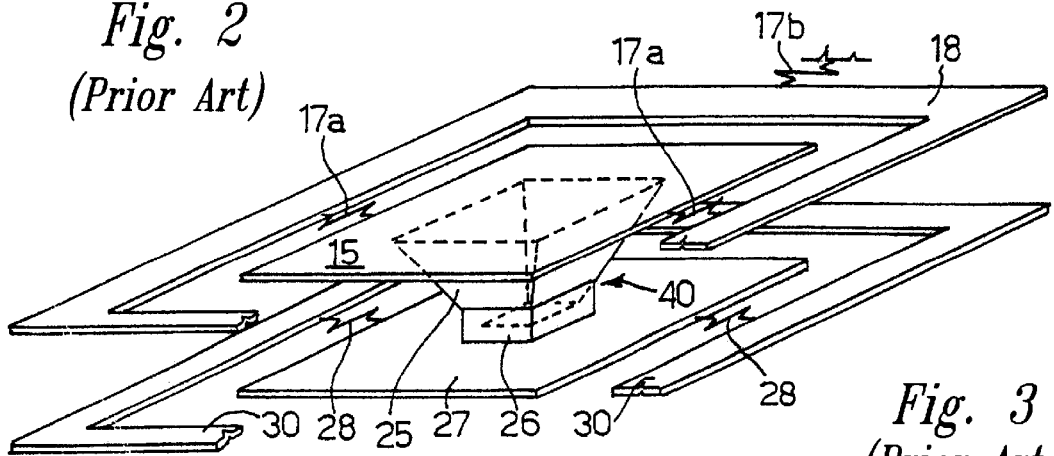
FIG. 3 shows a simplified perspective view of a second embodiment of a known switch.
Figure 4:
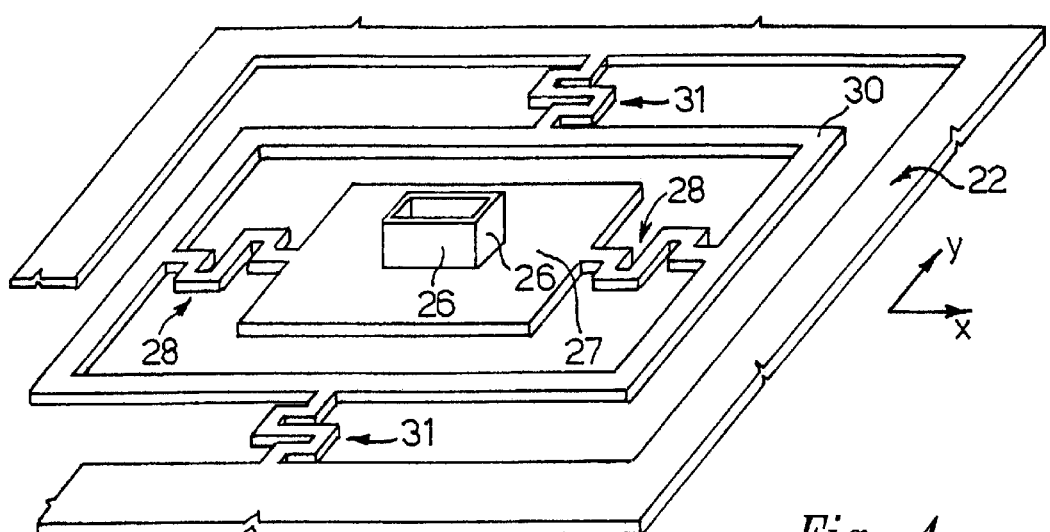
FIG. 4 shows a perspective view, at an enlarged scale, of a detail of FIG. 3.
Figure 5:
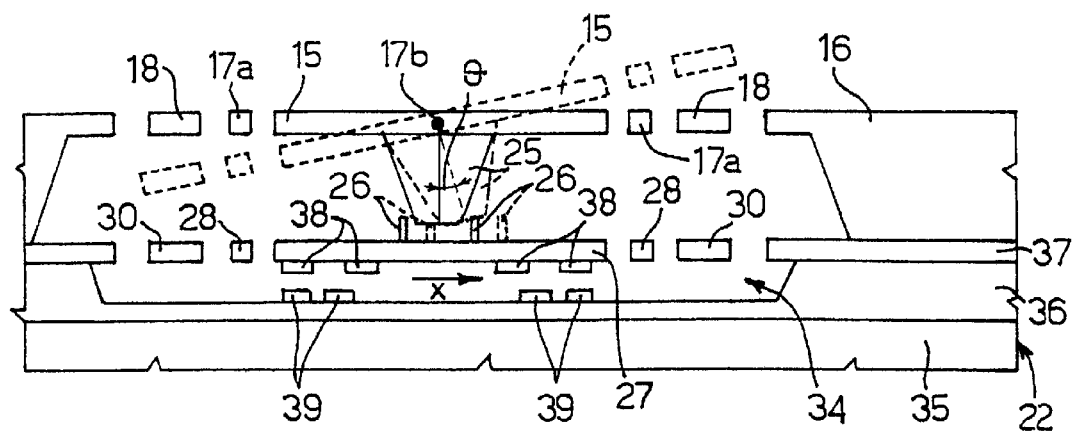
FIG. 5 shows a cross-section view of the known switch of FIG. 3.
Figure 6:
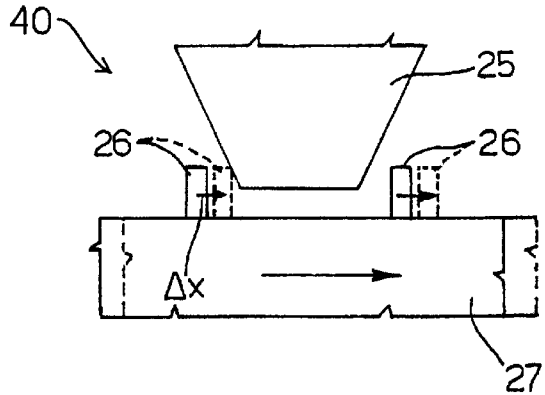
FIG. 6 shows an enlarged detail of FIG. 5.

The first wafer 51 has a structure similar to that of the first wafer 16 of FIG. 3, and thus comprises a platform 53, which is carried by spring elements 17a and a frame 55 and is integral with a lever 54 having the shape of a frusto-pyramid. In FIG. 7, only spring elements 17a are visible, which correspond to the spring elements 17a of FIG. 2; additional spring elements corresponding to 17b of FIG. 2, are not shown, but extend, perpendicular to the drawing plane. The second wafer 52 comprises a substrate 56, in which electronic components are integrated belonging to the control circuitry, and a protection layer 63 (for instance, a silicon dioxide layer) in which a cavity or depression 57 is present.

The third wafer 58 forms a plate 60 similar to the plate 27 of FIG. 3 and supported by a frame 61 similar to the frame 30, and spring elements similar to the spring elements 28 and 31 (of which spring elements 62 may be seen only in part).

The plate 60 has an underside 60a facing the cavity 57 and a top side 60b facing the platform 53.

Mobile electrodes 70 are arranged on the underside 60a of the plate 60, face the fixed electrodes 71 arranged on the bottom of the cavity 57 and form, with the mobile electrodes 70, actuation electrodes, in a known way. In practice, the plate 60, together with the frame 61, the spring elements 62, and the electrodes 70, 71 forms a linear actuator 65.

Figure 8:
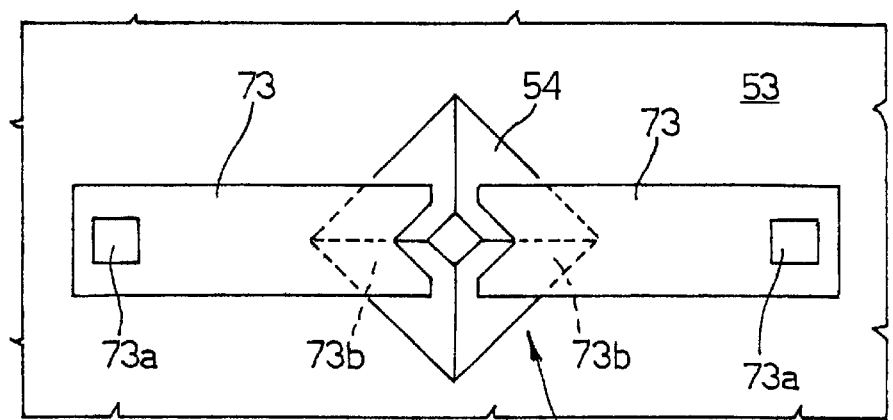
FIG. 8 shows a view from below on the self-centering assembly according to the invention, taken along line VIII—VIII of FIG. 7.
Figure 9:
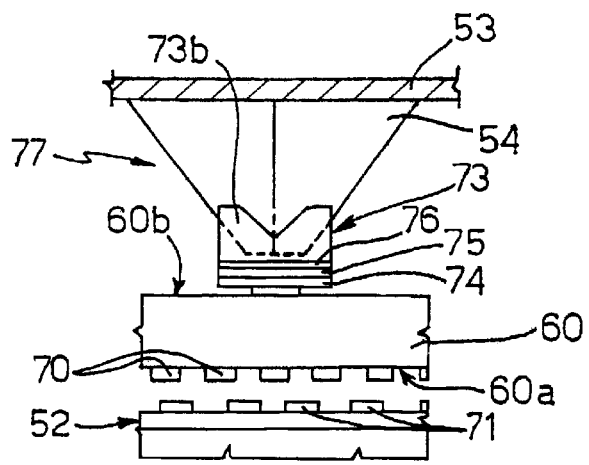
FIG. 9 shows a cross-section view of the microelectromechanical structure of FIG. 7, taken along line IX—IX.

Two engagement springs 73 are formed on the top side 60b of the plate 60. Each engagement spring 73 is formed by a metal plate having an elongated, arched shape (FIG. 8), with the concavity upwards. In detail, each engagement spring 73 has a first end 73a fixed to the plate 60 and a second end 73b free, defining a side forming a V-shaped notch which engages a respective edge of the lever 54. Each engagement spring 73 is formed by at least two metal layers arranged on top of one another and having different thermal expansion coefficients, so as to be subject to different stresses at room temperature and to cause deformation upwards after release, as explained hereinafter. In the illustrated example, three metal layers 74, 75 and 76 are present, for instance of titanium, aluminum, titanium, wherein the two titanium layers 74, 76 have a different thickness to ensure curving of the spring with the concavity upwards.

The engagement springs 73 and the lever 54 form an assembly 77, of a self-centring type, for converting a translation into a rotation, wherein the engagement springs 73 automatically adapt to the shape and position of the lever 54 upon bonding the first wafer 51 to the third wafer 58, as explained below.

The microelectromechanical structure is manufactured as described hereinafter. The first wafer 51 is etched on the back through a masked isotropic etch which stops on an oxide layer (not shown) arranged between a substrate (in which the lever 54 is to be defined) and an epitaxial layer (in which the platform 53 is to be defined); in this way, the lever 54 is formed.

The second wafer 52 is processed in a known way to form the desired components (not shown), the electrical connections (not shown either), and the dielectric protection layers, including the protection layer 63 in which the cavity 57 is formed. Subsequently, the fixed electrodes 71 are made inside the cavity 56.

Figure 10:
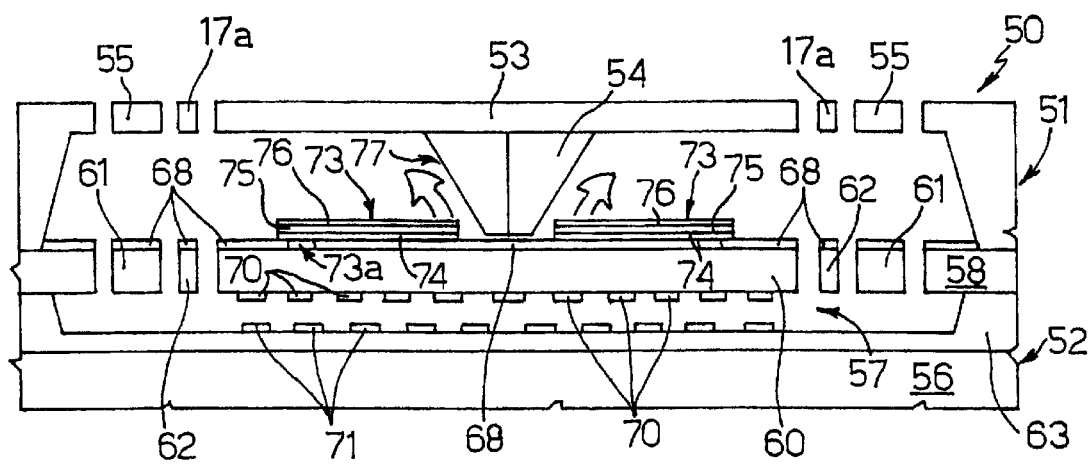
FIG. 10 shows a cross-section view, similar to that of FIG. 7, in an intermediate manufacturing step.

The mobile electrodes 70 are initially formed in the third wafer 58. The third wafer 58 is then turned upside down, bonded to the second wafer 52, and thinned out, as shown in FIG. 10. On the top face, corresponding to the side 60b of the plate 60, a sacrificial layer 68 is deposited and is then opened where the first ends 73a of the engagement springs 73 are to be made. The metal layers are deposited and then defined and form the engagement springs 73. At this stage, the engagement springs 73 still have a planar shape, since they are withheld by the sacrificial layer 68.

Next, trenches are formed in the third wafer 58 such as to define the plate 60, the frame 61 and the springs 62; the trenches extend down to the cavity 57.

Next, the first wafer 51 and the second wafer 58 are bonded together so that the lever 54 positions itself in the space existing above the second ends 73b of the engagement springs 73, without being engaged thereby, as illustrated in FIG. 10. At this point, the platform 53 and the spring elements 17a, 17b are defined. Before defining the platform 53 and the spring elements 17a, 17b, the first wafer 51 preferably undergoes chemical-mechanical polishing (CMP) and is coated with a metal layer which increases the reflecting power of the mirror element.

Finally, the sacrificial layer 68 is removed; consequently, the differential stress existing between the layers 74–76 (due to the different thermal expansion coefficients of the two metals, to the existing geometrical conditions, and to the working temperature which is different from the metal layer deposition temperature) causes the second end 73b of the engagement spring 73 to curve and engage with the lever 54, as indicated by the arrows of FIG. 10. By appropriately choosing the metals of the engagement springs 73 and the dimensions of the latter, it is possible to ensure that, in this phase, curving of the engagement springs 73 occurs with the ends 73b upwards and that the degree of curving will certainly be sufficient to engage the lever 54, as will be obvious to a person skilled in the field. On the other hand, the deformation of the engagement springs 73 ceases automatically when these have engaged the lever 54, and may be different for each spring. In practice, the engagement springs 73 adapt to the existing geometrical and spatial conditions, so causing the engagement springs 73 to self-center with respect to the lever 54.

In this way, the movement of the linear actuator 65, and in particular of the plate 60, always causes a corresponding rotation of the platform 53, so eliminating completely the hysteresis existing in known motion conversion assemblies. Furthermore, the continuous engagement, in all operating conditions, between the engagement springs 73 and the lever 54 ensures a control of the position of the platform 53 that is faster and more precise and enables convenient compensation of offset errors in the rest position of the platform 53.

The illustrated solution requires, for its manufacture, processing steps that are usual for the microelectromechanical structures and may thus be implemented easily and at contained costs.

Finally, it is clear that numerous modifications and variations can be made to the microelectromechanical structure described and illustrated herein, all falling within the scope of the invention, as defined in the attached claims. In particular, the material and the shape of the engagement springs 73 may vary with respect to the above description, as likewise the shape of the lever 54. In addition, the lever 54 and the engagement springs 73 may be exchanged with each other, and, if necessary, it is possible to provide a different number of engagement springs 73, for example four, extending perpendicular to one another in pairs, for engaging substantially opposite and planar walls of the lever. Finally, during manufacture, it is possible to release the engagement springs 73 prior to bonding the wafers 51, 52, 58, and to obtain self-centring engagement between the engagement springs 73 and the lever 54 during assembly.

What is claimed is:

1. A microelectromechanical structure comprising:
   a first part that is rotatably movable;
   a second part that is movable with translatory motion;
   an assembly for converting motion, arranged between said first and said second part and including a first and a second element, said first element being integral with said first part, and said second element being integral with said second part, one of said first and second elements comprising a projection, and the other one of said first and second element including elastic engagement elements, elastically loaded towards said projection.

2. A microelectromechanical structure according to claim 1, wherein said elastic engagement elements comprise at least one pair of metal plates each having a fixing portion integral with one of said first and second parts and an engagement portion engaging said projection.

3. A microelectromechanical structure according to claim 2, wherein each said metal plate has an elongated shape and comprises a first end forming said fixing portion and a second end defining an abutting edge cooperating with said projection.

4. A microelectromechanical structure according to claim 3, wherein said second end of each said metal plate is countershaped to said projection.

5. A microelectromechanical structure according to claim 4, wherein said projection has frusto-pyramid shape having edges facing towards elastic engagement elements, and said abutting edge has a V-shaped notch which engages a respective edge of said projection.

6. A microelectromechanical structure according to claim 2, wherein each said metal plate comprises at least two metal layers arranged on each other and having different thermal expansion coefficients.

7. A microelectromechanical structure according to claim 6, wherein each said metal plate comprises three metal layers arranged on each other and respectively comprising titanium, aluminium, and titanium.

8. A microelectromechanical structure according to claim 1, wherein said first part forms a mirror element of an optical switching device, and said second part comprises a linear actuator.

9. A microelectromechanical structure according to claim 1, wherein said first element is integral with said first part, and said second element is integral with said second part.

10. A process for manufacturing a microelectromechanical structure, comprising the steps of:

forming a first part which is rotatably movable, said step of forming a first part including the step of forming a first element belonging to a motion conversion assembly (and integral with said first part;

forming a second part that is movable with translatory motion, said step of forming a second part including the step of forming a second element belonging to said motion conversion assembly and integral with said second part;

one of said steps of forming a first and a second element including the step of forming a projection;

another of said steps of forming a first and a second element including the step of forming elastic engagement elements; and assembling said first part and second part, in so that, during said step of assembling, said elastic engagement elements automatically and elastically engage said projection.

11. A process according to claim 10, wherein said step of forming elastic engagement elements comprises forming elastic engagement elements that are elastically preloaded, and said step of assembling comprises the step of releasing said elastic engagement elements and enabling said elastic engagement elements to engage said projection.

12. A process according to claim 11, wherein said step of forming elastic engagement elements comprises the steps of forming a sacrificial region extending on top of one of said first and second parts, except for fixing areas; and forming said elastic engagement elements; and said step of assembling comprises the steps of fixing two semiconductor material wafers (58, 52) respectively carrying said first and said second part, and removing said sacrificial region.

13. A process according to claim 11 wherein said step of forming elastic engagement elements comprises the step of forming at least two metal plates each having a fixing portion integral with one of said first and said second part, and an engagement portion for engagement with said projection.

14. A process according to claim 13, wherein said step of forming metal plates comprises the steps of depositing at least two metal layers having different thermal expansion coefficients, and defining said metal layers.

15. A process according to claim 14, wherein said step of forming metal plates comprises the steps of depositing three metal layers arranged on each other, respectively of titanium, aluminium, and titanium.

16. A device comprising:

a first platform, rotatable about first and second axes, the first and second axes lying in a geometric plane of the first platform;

a projection shaped as a four sided pyramidal frustum, with a broad base affixed to a lower surface of the platform and a narrow base projecting downward from the platform;

a second platform, parallel to and beneath the first platform, translatable along third and fourth axes, the third and fourth axes lying in a geometric plane of the second platform and parallel to the first and second axes, respectively; and first and second engagement springs, each of the first and second engagement spring having outer and inner ends, the outer ends of the first and second engagement springs being affixed to an upper surface of the second platform, the inner ends of the first and second engagement springs flexing upward and capturing the projection between them.

17. The device of claim 16 wherein the projection has four vertical faces, and wherein the inner ends of the first and second engagement springs are shaped to engage opposing angles between the four vertical faces of the projection.

18. The device of claim 16 wherein a translation of the second platform along the third or fourth axis results in a rotation of the first platform on the second or first axis, respectively.

* * * * *